US006869892B1

United States Patent
Suzuki et al.

(10) Patent No.: US 6,869,892 B1
(45) Date of Patent: Mar. 22, 2005

(54) METHOD OF OXIDIZING WORK PIECES AND OXIDATION SYSTEM

(75) Inventors: Keisuke Suzuki, Tokyo-to (JP); Toshiyuki Ikeuchi, Tokyo-to (JP); Kimiya Aoki, Tokyo-to (JP); David Paul Brunco, San Jose, CA (US); Steven Robert Soss, San Jose, CA (US); Anthony Dip, Cedar Creek, TX (US)

(73) Assignees: Tokyo Electron Limited, Tokyo-To (JP); Intel Corporation, Santa Clara, CA (US)

( * ) Notice: Subject to any disclaimer, the term of this patent is extended or adjusted under 35 U.S.C. 154(b) by 0 days.

(21) Appl. No.: 10/767,470

(22) Filed: Jan. 30, 2004

(51) Int. Cl.[7] ............................................. H01L 21/31
(52) U.S. Cl. ...................... 438/770; 438/771; 438/773; 438/694; 438/735; 438/738; 438/769; 438/787
(58) Field of Search ................................ 438/770, 771, 438/773, 694, 735, 738, 769, 787

(56) References Cited

U.S. PATENT DOCUMENTS

| 5,374,314 | A | * | 12/1994 | Babacz ................ 118/723 MP |
| 6,037,273 | A | | 3/2000 | Gronet et al. |
| 6,599,845 | B2 | * | 7/2003 | Sato et al. .................. 438/770 |
| 2003/0224615 | A1 | * | 12/2003 | Nishino et al. ............. 438/758 |
| 2003/0224618 | A1 | * | 12/2003 | Sato et al. .................. 438/770 |
| 2003/0224619 | A1 | * | 12/2003 | Ono et al. .................. 438/771 |
| 2004/0094094 | A1 | * | 5/2004 | Ohmi et al. ........ 118/723 MW |

FOREIGN PATENT DOCUMENTS

| JP | 57-001232 | 1/1982 |
| JP | 03-140453 | 6/1991 |
| JP | 04-018727 | 1/1992 |
| JP | 2002-176052 | 6/2002 |
| JP | 2002-313728 | 10/2002 |
| JP | 2004-134729 | 4/2004 |

* cited by examiner

Primary Examiner—Matthew Smith
Assistant Examiner—Victor V Yevsikov
(74) Attorney, Agent, or Firm—Smith, Gambrell & Russell, LLP

(57) ABSTRACT

A method of oxidizing work pieces according to the present invention comprises the steps of: containing a plurality of work pieces W in a processing vessel 22 which has a predetermined length and is capable forming a vacuum therein, oxidizing surfaces of the work pieces in an atmosphere including active oxygen species and active hydroxyl species which are generated by supplying an oxidative gas and a reductive gas into the processing vessel to interact the gases. The oxidative gas and the reductive gas are respectively supplied into the processing vessel in the longitudinal direction. Parts of the reductive gas are additionally supplied from at least two or more independently controlled gas nozzles located at separate locations in the longitudinal direction of the processing vessel. The gas flow rate through each nozzle is set depending on any combination of the work pieces composed of product wafers, dummy wafers, and monitor wafers in the processing vessel.

9 Claims, 7 Drawing Sheets

METHOD OF OXIDIZING WORK PIECES AND OXIDATION SYSTEM

TECHNICAL FIELD

The present invention relates to a method of oxidizing surfaces of work pieces such as semiconductor wafers, and an oxidation system.

BACKGROUND ART

Generally, a semiconductor wafer such as a silicon substrate is subjected to various processes including a film forming process, an etching process, an oxidation process, a diffusion process, and a modification process to fabricate a semiconductor integrated circuit. For example, the oxidation process among those processes is used for oxidizing a surface of a single-crystal silicon film or polysilicon film and for oxidizing a metal film. The oxidation process is used mainly for forming gate oxide films and insulating films for capacitors.

Oxidation methods are classified by pressure into atmospheric pressure oxidation methods that are carried out in an atmospheric atmosphere and vacuum oxidation methods that are carried out in a vacuum atmosphere. Oxidation methods are classified by oxidizing gas into wet oxidation methods including a wet oxidation method disclosed in, for example, Japanese Patent Laid-Open Publication No. 140453/1991, that use steam generated by burning hydrogen in an oxygen atmosphere in an external combustor, and dry oxidation methods including a dry oxidation method disclosed in, for example, Japanese Patent Laid-Open Publication No. 1232/1982 that supply only ozone or oxygen into a processing vessel.

In view of quality and characteristics including dielectric strength, corrosion resistance and reliability, an insulating film formed by a dry oxidation process is superior to that formed by a wet oxidation process. In view of deposition rate and intrafilm uniformity, generally, an oxide film (insulating film) formed by an atmospheric oxidation process is satisfactory in oxidation rate but the same is not satisfactory in the intrafilm thickness uniformity of an oxide layer formed on the surface of the wafer. On the other hand, an oxide film formed by a decompressed wet oxidation process is satisfactory in the intrafilm thickness uniformity of the oxide layer but the same is not satisfactory in oxidation rate.

Design rules that have been hitherto applied to designing semiconductor integrated circuits have not been very sever the aforesaid various oxidation methods have been selectively used taking into consideration purposes of oxide films, process conditions and equipment costs. However, line width and film thickness have been progressively decreased and severer design rules have been applied to designing semiconductor integrated circuits in recent years, and design rules requires higher film characteristics and higher intrafilm thickness uniformity of films. The conventional oxidation methods are unable to meet such requirements satisfactorily.

A wet oxidation system disclosed in, for example, Japanese Patent Laid-Open Publication No. 18727/1992 supplies $H_2$ gas and $O_2$ gas individually into a lower region in a vertical quartz reactive tube, burns the $H_2$ gas in a combustion space defined in a quartz cap to produce steam, makes the steam flow upward along a row of wafers to accomplish an oxidation process. Since this prior art oxidation system burns $H_2$ gas in the combustion space, a lower end region in the processing vessel has a high steam concentration, the steam is consumed as the same flows upward and an upper end region in the processing vessel has an excessively low steam concentration. Accordingly, the thickness of an oxide film formed on the surface of the wafer is greatly dependent on the position where the wafer is held for the oxidation process and, in some cases, the interfilm thickness uniformity of the oxide film is deteriorated.

Another oxidation system disclosed in, for example, Japanese Patent Laid-Open Publication No. 1232/1982 arranges a plurality of semiconductor wafers in a horizontal batch-processing reaction tube, supplies $O_2$ gas or supplies $O_2$ gas and $H_2$ gas simultaneously through one of the opposite ends of the reaction tube into the reaction tube, and forms an oxide film in a decompressed atmosphere. However, since this prior art oxidation system forms a film in an atmosphere of a relatively high pressure by a hydrogen burning oxidation method, steam is a principal element of reaction, an upper region with respect to the flowing direction of gases in the processing vessel and a lower region in the processing vessel differ excessively from each other in steam concentration and hence it is possible that the interfilm thickness uniformity of the oxide film is deteriorated.

A third oxidation system disclosed in, for example, U.S. Pat. No. 6,037,273 supplies $O_2$ gas and $H_2$ gas into the processing chamber of a wafer-fed processing vessel provided with a lamp heating device, makes the $O_2$ gas and the $H_2$ gas interact in the vicinity of the surface of a semiconductor wafer placed in the processing chamber to produce steam, and forms an oxide film by oxidizing the surface of the wafer with the steam. However, this oxidation system supplied $O_2$ gas and $H_2$ gas through gas inlets spaced a short distance in the range of 20 to 30 mm from the wafer into the processing chamber, makes the $O_2$ gas and the $H_2$ gas interact in the vicinity of the surface of the semiconductor wafer to produce steam, and forms the oxide film in an atmosphere of a relatively high process pressure. Thus, it is possible that the intrafilm thickness uniformity of the film is deteriorated.

In order to solve the above disadvantages, Japanese Patent Laid-Open Publication No. 2002-176052 disclosed by the Applicant supplies simultaneously an oxidative gas such as $O_2$ gas and a reductive gas such as $H_2$ gas to the upper and lower regions of a process chamber, makes the gases interact in a vacuum atmosphere to form an atmosphere mainly including active oxygen species and active hydroxyl species, and oxidizes a silicon wafer or the like in this atmosphere.

The oxidizing method is described in brief with reference to FIG. 8. FIG. 8 is a schematic structural view of a conventional oxidation system. As shown in FIG. 8, the oxidation system 2 includes a tubular processing vessel 6 of a vertical type, and a resistive heater 4 disposed on an outer periphery of the processing vessel 6. The processing vessel 6 has a wafer boat 8 which is capable of being vertically loaded and unloaded from a lower side of the processing vessel 6. Semiconductor wafers W such as silicon substrates are mounted and held on the wafer boat 8 in a tier-like manner. An $H_2$ gas nozzle 10 for supplying $H_2$ gas and an $O_2$ gas nozzle 12 for supplying $O_2$ gas are disposed on a lower part of a sidewall of the processing vessel 6. An exhaust port 14 connected to a not-shown vacuum pump is disposed on an upper part of the processing vessel 6.

The $H_2$ gas and the $O_2$ gas are introduced from the nozzles 10 and 12 to the lower part of the processing vessel 6. The $H_2$ gas and the $O_2$ gas interact with each other in the processing vessel 6 under pressure of less than 133 Pa, while generating active oxygen species and active hydroxyl species. These species move upward in the processing vessel 6, while contacting surfaces of the wafers W to oxidize the same.

According to the oxidation methods disclosed in the above respective documents, an oxide film of a suitable quality can be formed, as well as a high intrafilm thickness uniformity of the oxide film can be maintained. However, in the oxidizing method disclosed by Japanese Patent Laid-Open Publication No. 2002-176052 which uses active species, there is a problem in that an interfilm thickness uniformity is significantly unsatisfactory, which indicates a difference of the film thicknesses of the wafers. This may be because a concentration of the active species is higher on the upstream of the gas flow, while it becomes low on the downstream of the gas flow. To be specific, the interfilm thickness uniformity is dependent on the silicon surface area to be oxidized. For example, when a lot of dummy wafers each having a sufficiently thick (e.g., 100 nm–1 $\mu$m) oxide film thereon are loaded in a furnace, less active species are consumed. On the other hand, when the silicon surface area to be oxidized is relatively large, more active species are consumed, provided the same concentration of the active species exist in the furnace. Similarly, an amount of consumption of the active species depends on a size of the silicon surface of a semiconductor integrated circuit which is subjected to an atmosphere of the active species. (This is referred to as "loading effect".) The loading effect causes a significant deterioration of the interfilm thickness uniformity of the oxide films. Conventionally, a temperature distribution in a furnace has been varied in order to compensate for lower concentration of active species. That is, a temperature adjustment is performed by increasing the temperature at a location where the film thickness is small (i.e., on the downstream of the gas flow) to accelerate an oxidation, so that a uniform film thickness distribution can be obtained in the furnace. Specifically, a temperature gradient of 10° C. to 100° C. is provided in a longitudinal direction of the furnace so as to secure the uniform thicknesses of the wafers (wafers arranged in the longitudinal direction of the furnace).

In recent years, since semiconductor integrated circuits are used for various applications, there is a tendency that many kinds of semiconductor integrated circuits are manufactured in small amounts. The wafer boat 8 can contain up to about 50 to 150 pieces of product wafers as a maximum capacity. However, it is possible that a quantity of product wafers less than the maximum capacity of the wafer boat 8, are contained in the wafer boat 8. Since the wafer boat 8 is not fully filled, dummy wafers are contained in a vacant space for the absent wafers to fill the wafer boat 8, in order not to give harmful effects to a temperature distribution and a gas flow in the processing vessel 6, when an oxidation treatment is carried out. Thus, the distribution and amount of the active species are largely varied depending on a containing condition of the product wafers and the dummy wafers in the wafer boat. Thus, a disadvantageous effect may occur that high interfilm thickness uniformity is not maintained.

SUMMARY OF INVENTION

In view of the above disadvantages, the present invention is made to efficiently solve the same. An object of the present invention is to provide a method of oxidizing work pieces and an oxidation system which can form an atmosphere mainly including active oxygen species and active hydroxyl species and maintain a substantially uniform temperature distribution in a longitudinal direction of the furnace when forming oxide films, and which can maintain a high interfilm thickness uniformity of oxide films, by changing positions for supplying a reductive gas which is additionally supplied from gas injection ports disposed on separate locations of a processing vessel in a longitudinal direction, depending on a containing condition of product work pieces and dummy work pieces in a wafer boat.

A method of oxidizing work pieces according to the present invention comprises the steps of: containing a plurality of work pieces in a processing vessel which has a predetermined length and is capable of forming a vacuum therein, and oxidizing surfaces of the work pieces in an atmosphere including active oxygen species and active hydroxyl species which are generated by supplying an oxidative gas and a reductive gas into the processing vessel to interact the gases, the oxidative gas and the reductive gas being respectively supplied in the vessel in the longitudinal direction, wherein the reductive gas is supplied additionally from at least two or more independently controlled gas nozzles located at separate locations in the longitudinal direction of the processing vessel, and the gas flow rate through each nozzle is set depending on any combination of the work pieces consisted of product wafers and dummy wafers or monitor wafers in the processing vessel.

According to the present invention, the oxidative gas and the reductive gas are respectively supplied into the processing vessel, and the gas flow rate supplied from at least two or more nozzles located at separate locations in the longitudinal direction of the processing vessel is independently controlled depending on a containing condition of product work pieces and the dummy work pieces or monitor wafers. Thus, a high interfilm thickness uniformity of oxide films can be maintained, irrespective of the number of product work pieces.

A method of oxidizing work pieces according to the present invention comprises the steps of: containing a plurality of work pieces in a processing vessel which has a predetermined length and is capable of forming a vacuum therein, and oxidizing surfaces of the work pieces in an atmosphere including active oxygen species and active hydroxyl species which are generated by supplying an oxidative gas and a reductive gas into the processing vessel to interact the gases, the oxidative gas and the reductive gas being respectively supplied in the vessel in the longitudinal direction, wherein supplying at least three independently controlled reductive gas nozzles are located at separate locations in the longitudinal direction of the processing vessel; and controlling the gas flow rates through each nozzle is set depending on any combination of the work pieces consisted of product wafers and dummy wafers or monitor wafers in the processing vessel.

According to the present invention, since at least three independently controlled reductive gas nozzles are used, it is possible to maintain a high interfilm thickness uniformity of oxide films, irrespective of the number of product work pieces in a furnace.

In the method of oxidizing work pieces, containing the work pieces in the processing vessel consist of any number of product wafers.

According to the present invention, each reductive gas flow rate is controlled with respect to a desired film thickness.

In the method of oxidizing work pieces, controlling the flow rate through each reductive gas nozzle is set based on the desired film thicknesses.

In the method of oxidizing work pieces, controlling the flow rate through each reductive gas nozzle is set based on the desired longitudinal concentration profile of active oxygen species or the active hydroxyl species within the processing vessel.

An oxidation system according to the present invention comprises: a holding means which holds a plurality of work pieces at predetermined pitches; a processing vessel which has a predetermined length for containing the holding means, and is capable of forming a vacuum therein; a heating means which heats the work pieces, an oxidative gas supply means which supplies an oxidative gas into the processing vessel; a reductive gas supply means which supplies a reductive gas into the processing vessel including at least three independently controlled reductive gas nozzles for supplying the reductive gas to separate locations along the longitudinal direction of the processing vessel; and a system controller controlling the individual gas flow rate of the reductive gas supplied from the reductive gas nozzles.

In the oxidation system, the work pieces held by the holding means consist of any number of product wafers.

In the oxidation system, the system controller controls the individual flow rate of the reductive gas supplied from at least three independently controlled reductive gas nozzles based on the desired film thicknesses.

In the oxidation system, the system controller sets controlling the flow rate of each reductive gas nozzle so as to provide the desired concentration profile in the longitudinal direction of the active oxygen species or the active hydroxyl species.

According to the method of oxidizing work pieces and the oxidation system of the present invention, the following excellent effect can obtained.

For one embodiment, that is, since the oxidative gas and the reductive gas are respectively supplied from one of the ends of the processing vessel even when a temperature in the furnace is substantially constant, and the gas flow rate of each part of the additionally supplied reductive gas which is supplied from the separate locations in the longitudinal direction of the processing vessel is optimized depending on a containing condition of product work pieces and the dummy work pieces, a high interfilm thickness uniformity oxide films can be maintained irrespective of the number of product work pieces.

DETAILED DESCRIPTION OF THE INVENTION

A method of oxidizing work pieces and an oxidation system according to the present invention are described in detail, with reference to the accompanying drawings.

Figure 1:
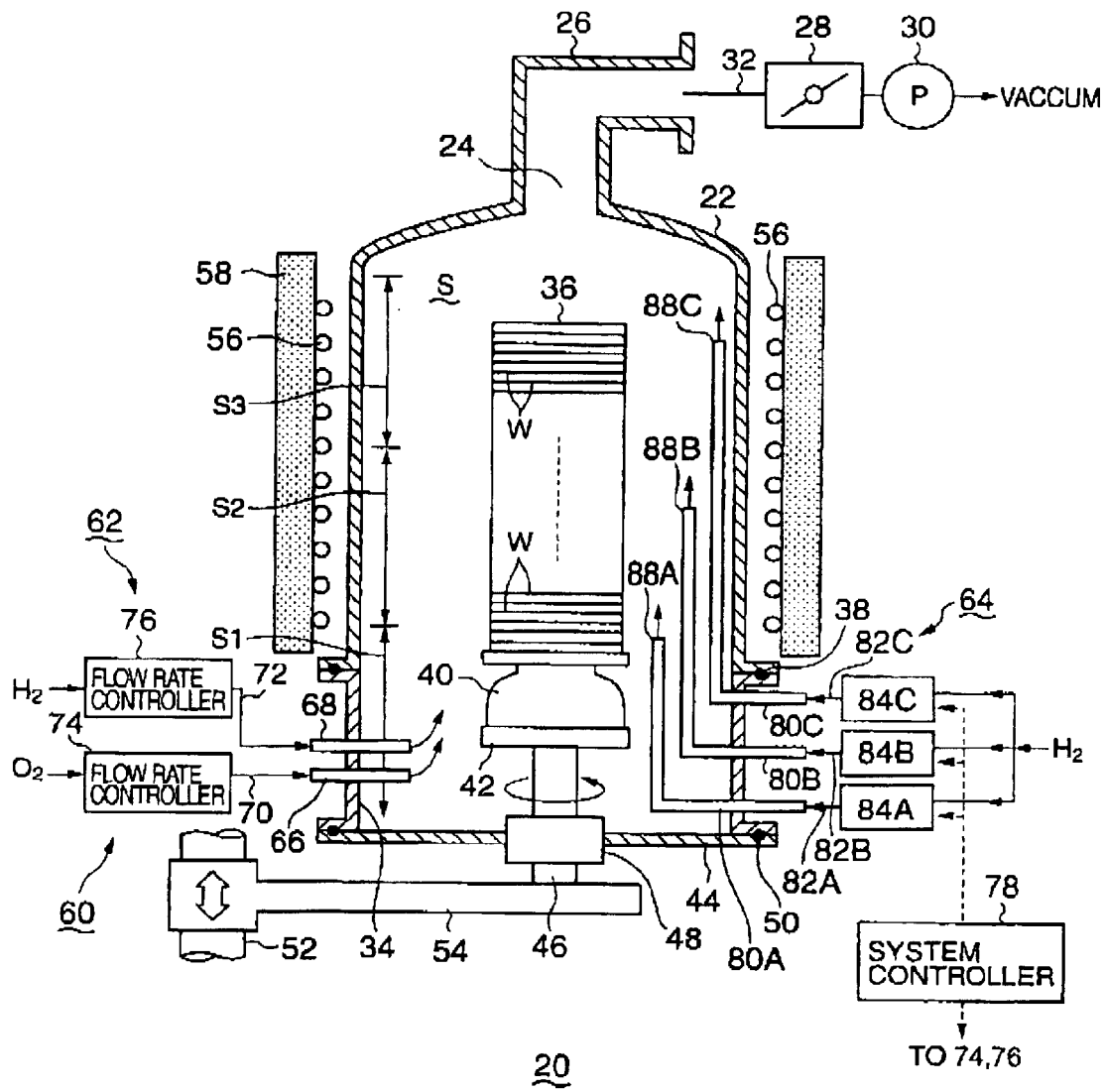
FIG. 1 is a structural view showing an example of an oxidation system for embodying the present invention.

FIG. 1 is a structural view showing an example of an oxidation system for embodying the present invention. The oxidation system is described in the first place. As shown in FIG. 1, the oxidation system 20 includes a cylindrical processing vessel 22 of a vertical type which has a lower end opened, and has a predetermined length in a vertical direction. The processing vessel 22 may be made of, for example, quartz having a high heat resistance.

An opened exhaust port 24 is disposed on a top of the processing vessel 22. An exhaust line 26, which is bent at a right angle and transversely extends, for example, is combined with the exhaust port 24. The exhaust line 26 is connected to a vacuum exhaust system 32 having a pressure control valve 28 and a vacuum pump 30 disposed thereal-ong. Thus, an atmosphere in the processing vessel 22 can be vacuumed and exhausted.

The lower end of the processing vessel 22 is supported by a tubular manifold 34 which is made of, for example, stainless steel. A wafer boat 36 made of quartz can be vertically taken in and out of a lower part of the manifold 34. The wafer boat 36 serves as a holding means, and contains a plurality of semiconductor wafers W as work pieces disposed thereon at predetermined pitches in a tier-like manner. A sealing member 38 such as an O-ring is provided between the lower end of the processing vessel 22 and the upper end of the manifold 34 so as to maintain an air-tightness of this part. In the present embodiment, the wafer boat 36 can hold about 50 pieces of wafers W having a diameter of 300 mm at substantially constant pitches in a tier like manner.

The wafer boat 36 is mounted on a table 42 through a heat insulation tube 40 made of quartz. The table 42 is supported on an upper end of a rotary shaft 46 passing through a cover 44 which opens and closes a lower opening of the manifold 34. A magnetic fluid seal 48 is disposed on a passing part of the rotary shaft 46 so as to air-tightly seal the rotary shaft 46 as well as rotatably support the same. A seal member 50 such as an O-ring is provided between a periphery of the cover 44 and the lower end of the manifold 34 so as to air-tightly seal the processing vessel 22.

The rotary shaft 46 is attached to an end of an arm 54 supported by an elevating mechanism 52 such as a boat elevator. Thus, the wafer boat 36 and the cover 44 can be vertically moved together. Alternatively, the table 42 may be secured to the cover 44 so that the wafers W are treated without rotating the wafer boat 36.

A heating means 56 as a heater, including carbon wire, which is described in, for example, Japanese Patent Laid-Open Publication No. 2003-209063 is disposed to surround the processing vessel 22. Thus, the processing vessel 22 inside the heating means 56 and the semiconductor wafers W contained in the processing vessel 22 can be heated. Such a carbon wire heater can provide a clean process, and has a satisfactory rising and lowering temperature property. A heat insulation material 58 is disposed on an outer periphery of the heating means 56 so as to ensure a thermal stability of the heating means 56. Gas supply means for introducing and supplying various gases to the processing vessel 22 are disposed on the manifold 34.

Specifically, the manifold 34 has an oxidative gas supply means 60 for supplying an oxidative gas to the processing vessel 22, a reductive gas supply means 62 for supplying a reductive gas to the processing vessel 22, and a reductive gas supply means 64 for additionally supplying the reductive gas to the processing vessel 22. The oxidative gas supply means 60 and the reductive gas supply means 62 respectively have an oxidative gas injection nozzle 66 and a reductive gas injection nozzle 68. Each nozzle 66 and 68 passes through a sidewall of the manifold 34, and an end thereof is inserted to a lower part end of the processing vessel 22. Flow rate controllers 74 and 76 such as mass flow controllers are respectively disposed on gas passages 70 and 72 which are extended from the respective injection nozzles 66 and 68. A control part 78 such as a microcomputer controls the respective flow rate controllers 74 and 76 so that gas flow rates supplied by the respective nozzles 66 and 68 can be controlled.

The reductive gas supply means 64, which is a characteristic element of the present invention, additionally supplies the reductive gas to a midstream of the processing vessel 22 in a longitudinal direction. In this embodiment, the additional reductive gas supply means 64 has a plurality of, e.g., three additional nozzles 80A, 80B, and 80C which pass through the sidewall of the manifold 34 and are bent in an L-shape to upwardly extend. Flow rate controllers 84A, 84B, and 84C such as mass flow controllers are respectively disposed on the midstream of gas passages 82A, 82B, and 82C which are respectively extended from the additional nozzles 80A, 80B, and 80C. Thus, the amount of each part of the reductive gas additionally supplied can be individually controlled by the system controller 78. Parts of the reductive gas of predetermined gas flow rates are constantly supplied by the respective additional nozzles 80A to 80C in the course of an oxidation treatment. Each gas flow rate is previously determined by a method which is described below. Ends of the respective additional nozzles 80A to 80C provide gas injection ports 88A, 88B, and 88C. The respective gas injection ports 88A to 88C are disposed on separate locations in the midstream of the processing vessel 22 in the longitudinal (vertical) direction. Herein, a containing region S in the processing vessel 22 where the wafers W are arranged is divided into, for example, three regions, i.e., an upstream region S1, a midstream region S2, and a downstream region S3, along a flowing direction of the gas. The gas injection ports 88A to 88C are disposed to respectively correspond to the regions S1 to S3.

To be specific, a space where the wafers W are contained in the processing vessel 22 provides the containing region S. In this embodiment, a gas introduced to the processing vessel 22 is flown upward in the containing region S from the introduced position, and is discharged from the exhaust port 24 disposed on the upper end of the processing vessel 22. The containing region S is slightly larger, in a vertical direction, than a length of the wafer boat 36, and is divided into, for example, three regions along a gas flowing direction. That is, the containing region S is divided into the upstream region S1 (a lower region in the drawing), the midstream region S2 (a center region in the drawing), and the downstream region S3 (an upper region in the drawing). For example, the gas injection port 88A of the shortest additional nozzle 80A is positioned to correspond to the upstream region S1. In more detail, it is preferable that the gas injection port 88A is positioned adjacent to a lower end of the wafer boat 36.

Preferably, the gas injection port 88B of the additional nozzle 80 is positioned on substantially a center part of the midstream region S2, and the gas injection port 88C of the longest additional nozzle 80C is positioned on the downstream region S3 and is slightly lower than an upper end of the wafer boat 36. The division of the respective regions is shown only by way of example. The less number of regions or the more number of regions are possible, and additional nozzles may be disposed correspondently thereto. Representatively, $O_2$ gas is used as a oxidative gas, and $H_2$ gas is used as a reductive gas. Although not shown, an inert gas supply means for supplying inert gas such as $N_2$ gas according to need is disposed on the oxidation system 20. The oxidation treatment is carried out under the circumstance where the temperature distribution in the longitudinal direction of the processing vessel is substantially uniform. The temperature is set within a range of from $-10°$ C. to $10°$ C. relative to the set temperature in the wafer boat area.

Then, an oxidizing method carried out by the oxidation system 20 as constituted above is described.

When the oxidation system 20 is in a waiting condition with the semiconductor wafers W such as silicon wafers being unloaded, the processing vessel 22 is maintained at a temperature lower than a process temperature. The wafer boat 36, which has, e.g., 100 pieces of wafers W as a maximum capacity arranged thereon, is elevated to be loaded from below to the processing vessel 22 in a hot wall condition. The lower opening of the manifold 34 is closed by the cover 44 so that the processing vessel 22 is air-tightly sealed. Among the semiconductor wafers W as work pieces, there are product semiconductor wafers (hereinafter sometimes referred to as "product wafers") PW as product work pieces. In addition, when the number of product wafers PW is less than the number of maximum capacity of the wafer boat 36, dummy semiconductor wafers DW (hereinafter sometimes referred to as "dummy wafers") as dummy work pieces are contained in the wafer boat 36 in order to fill a vacant space in the wafer boat 36. As described above, each dummy wafer has a sufficiently thick $SiO_2$ film formed on its surface. In addition, semiconductors for monitoring film thicknesses MW (hereinafter sometimes referred to as "monitor wafer") are contained in a given position on the boat according to need, in order to measure a film thickness distribution in the furnace.

Then, the processing vessel 22 is vacuumed to maintain at a predetermined process pressure, and a supply power to the heating means 56 is increased. Thus, a wafer temperature is elevated to a process temperature for carrying out an oxidation treatment and the temperature is stabilized. In this step, in order to make the temperature hysteresis of the wafers be uniform, the temperature for the oxidation treatment in the furnace is set such that the wafers have substantially the same temperature. Specifically, the temperature is set such that both the product wafers and the dummy wafers have substantially the same temperature within a range of from $-10°$ C. to $10°$ C. relative to the set temperature.

Thereafter, predetermined process gases required for carrying out the oxidation treatment, that is, $O_2$ gas and $H_2$ gas are supplied to the processing vessel 22 with their flow rates being controlled, through the oxidative gas injection nozzle 66 of the oxidative gas supply means 60, the reductive gas injection nozzle 68 of the main reductive gas supply means 62, and the additional nozzles 80A to 80C of the additional reductive gas supply means 64.

The $O_2$ gas and $H_2$ gas flow upward in the processing vessel 22 while interacting with each other in a vacuum atmosphere to generate active hydroxyl species and active oxygen species. The gases reach the wafers W contained in the rotating wafer boat 36, so that surfaces of the wafers W are subjected to the oxidation treatment. Then, the process gases or the gases generated by the interaction are discharged outside the system through the exhaust port 24 disposed on the top of the processing vessel 22.

The gas flow rate of the $H_2$ gas is, e.g., 1000 sccm in a range of from 200 sccm to 5000 sccm. The gas flow rate of the $O_2$ gas is e.g., 2000 sccm in a range of from 200 sccm to 10000 sccm.

Details of the oxidation treatment are described below. The $O_2$ gas and the $H_2$ which are individually introduced to the processing vessel 22 flow upward in the processing vessel 22 in a hot wall condition. An atmosphere mainly including active oxygen species (O*) and active hydroxyl species (OH*) is formed close to the wafers W through a combustion reaction of hydrogen. The surfaces of the wafers W are oxidized by these active species so that an $SiO_2$ film is formed on the wafers W. The process conditions are as follows:

The wafer temperature is in a range of from 400° C. to 1000° C. The pressure is, in a range of from 13.3 Pa to 1330 Pa. The process time is e.g., about 1 minutes to 100 minutes which is dependent on a film thickness to be formed.

Forming processes of these active species are considered as described below. By individually introducing hydrogen and oxygen to the processing vessel 22 in a hot wall condition in a decompressed atmosphere, it is considered that the following combustion reaction processes of hydrogen occur close to the wafers W. In the below formulas, a chemical symbol with asterisk mark (*) indicates active species thereof.

$$H_2 + O_2 \rightarrow H^* + HO_2$$

$$O_2 + H^* \rightarrow OH^* + O^*$$

$$H_2 + O^* \rightarrow H^* + OH^*$$

$$H_2 + OH^* \rightarrow H^* + H_2O$$

When the $H_2$ gas and the $O_2$ gas are individually introduced to the processing vessel 22, O* (active oxygen species), OH* (active hydroxyl species), and $H_2O$ (steam) are generated in the course of the combustion reaction process of hydrogen whereby the wafer surfaces are oxidized to form an $SiO_2$ film. At this time, it is considered that the active species of O* and OH* largely affect the oxidation. In the present invention, a required amount of $H_2$ gas is additionally supplied to the respective upstream region S1, the midstream region S2, and the downstream region S3 of the containing region S by using the additional nozzles 80A to 80C. Each part of the additionally supplied $H_2$ gas sequentially interact the $O_2$ gas flowing upwardly from below. Thus, the active oxygen species and the active hydroxyl species, which have been consumed or devitalized to be scarce, are newly formed to compensate the same. Therefore, the active species of an appropriate amount exist at any height position of the wafers W in a direction of an interfilm (a height direction), so that a uniform concentration of the active species can be achieved. As a result, an interfilm thickness uniformly of the oxide films selectively formed on a surface of a silicon layer can be improved.

The flow rate of each part of the reductive gas supplied from each additional nozzle 80A to 80C is previously determined, depending on a containing condition of the product wafers PW and the dummy wafers DW which are contained in the processing vessel 22, i.e., the wafer boat 36. To be specific, the flow rate of each part of the reductive gas is set by previously calculating the same by an experiment or a simulation, based on film thicknesses of oxide films which are formed upon an oxidation treatment by supplying individually the reductive gas from each additional nozzle 80A to 80C, such that a high interfilm uniformity of the film thicknesses is obtained. The conditions of individually supplying the reductive gas includes the following three cases, that is, a condition where the $H_2$ gas is additionally supplied from the additional nozzle 80A while the $O_2$ gas and the $H_2$ gas are respectively supplied from the nozzles 66 and 68, a condition where the $H_2$ gas is additionally supplied from the additional nozzle 80B while the $O_2$ gas and the $H_2$ gas are respectively supplied from the nozzles 66 and 68, and a condition where the $H_2$ gas is additionally supplied from the additional nozzle 80C while the $O_2$ gas and the $H_2$ gas are respectively supplied from the nozzles 66 and 68. In these conditions, the respective gases are supplied to carry out the oxidation treatment, and film thicknesses of the oxide films are previously measured, which is described below. Based on the thus set values, the flow rate of each part of the additionally supplied reductive gas from each additional nozzle 80A to 80C is previously calculated by carrying out a simulation as described above.

A process for determining the flow rate of each part of the additionally supplied reductive gas is described below.

<Thicknesses of $SiO_2$ Films Formed on Wafers>

Figure 2:
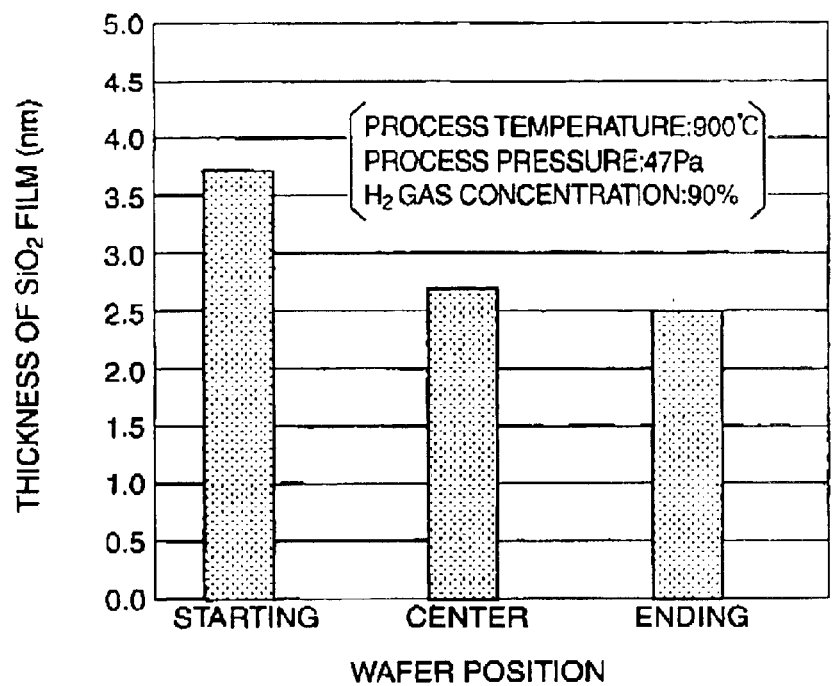
FIG. 2 is a graph showing a relationship of a wafer position and an SiO$_2$ film thickness.

An inclination of thicknesses of $SiO_2$ films formed on the wafers was examined. FIG. 2 shows the result. FIG. 2 is a graph showing a relationship of a wafer position and an $SiO_2$ film. In FIG. 2, the terms "Starting", "Center", and "Ending" indicates the respective positions of the wafer boat 36. The "Starting", "Center", and "Ending" respectively represent a lower position, a center position, and a top position of the wafer boat 36 shown in FIG. 1, when the wafer boat 36 is substantially equally divided in a height direction thereof.

The process conditions were as follows: The process pressure was 47 Pa (0.35 torr), the process temperature was 900° C., and a concentration of $H_2$ gas $[H_2/(H_2+O_2)]$ was 90%. 100 pieces of product wafers (bare wafers) as a maximum capacity of the wafer boat 36 were contained therein. Monitor wafers for measuring a film thickness were of course contained in a plurality of predetermined locations.

As apparent from FIG. 2, it was confirmed that the film thickness on the "Starting" position which is upstream of a gas flow is large, while the film thickness gradually became smaller from the "Center" position to the "Ending" position which are downstream of the gas flow, because the active species decreased in number. As a result, it was found that the film thicknesses on the "Center" and "Ending" positions must be enlarged in order to improve an interfilm thickness uniformity.

<Relationship of $H_2$ Gas Concentration and Film Thickness>

Figure 3:
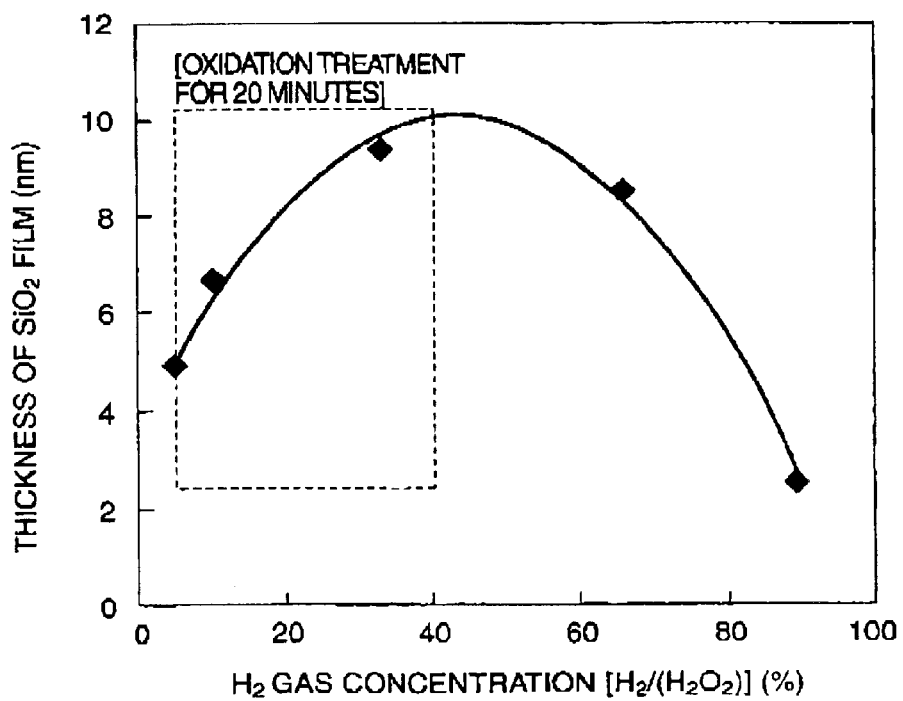
FIG. 3 is a graph showing a relationship of an H$_2$ gas concentration and a thickness of an SiO$_2$ film thickness.

A relationship of the $H_2$ gas concentration and a film thickness was then examined. FIG. 3 is a graph showing a relationship of an $H_2$ gas concentration $[H_2/(H_2+O_2)]$ and a thickness of the $SiO_2$ film. FIG. 3 shows the film thicknesses when carrying out an oxidation treatment for 20 minutes, with the $H_2$ gas concentration being varied from 5% to 90%. As shown in FIG. 3, in a region where the $H_2$ gas concentration is equal to or less than 40% (indicated by a broken line in FIG. 3), the higher the $H_2$ gas concentration is, the larger the film thickness becomes. As a result, it was found that, in the region where the $H_2$ gas concentration is equal to or less than 40%, the $H_2$ gas is supplied to raise the $H_2$ gas concentration so as to enlarge the film thickness. Thus, in the present invention, the $H_2$ gas is additionally supplied in the course of the gas flow in the processing vessel 22. When the $H_2$ gas concentration is too low, an oxidation speed becomes too slow to make a throughput excessively small. Thus, the lower limit of the $H_2$ gas concentration is about 5%.

<Containing Condition of Product Wafers and Dummy Wafers>

Figure 4:
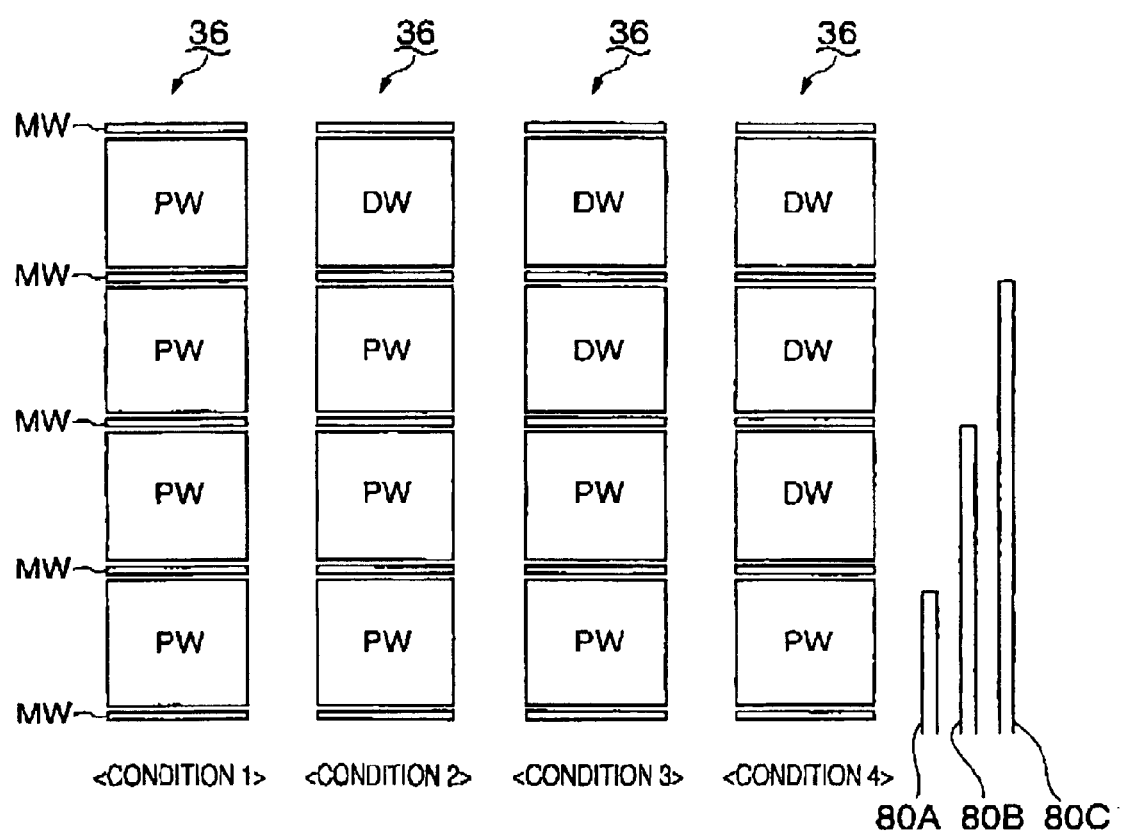
FIG. 4 is a view showing representative examples of containing condition of product wafers and dummy wafers and monitor wafers.

As shown in FIG. 4, in the actual oxidation treatment, there are the case where product wafers PW are contained in the wafer boat 36 up to the maximum capacity thereof, and the case where the product wafers PW are contained in a part of the wafer boat 36 and dummy wafers DW are contained in a remaining region thereof, which is described above. FIG. 4 is a view showing representative examples of containing condition of the product wafers and the dummy wafers. In FIG. 4, positions of the additional nozzles 80A to 80C are schematically shown.

In FIG. 4, the containing region of the wafer boat 36 is divided into four areas as a matter of convenience. Five pieces of monitor wafers MV for measuring a film thickness are arranged between the respective areas, the uppermost part, and the lowermost part. Each area can contain, for example, 25 pieces of wafers, and thus 100 pieces of wafers can be contained in the wafer boat 36. The product wafers PW are generally contained on the upstream of the gas flow rate (lower part of the wafer boat 36 in FIG. 4). In the condition 1, the product wafers PW are contained in the all areas. In the condition 2, the product wafers PW are contained in the three upstream areas and the dummy wafers DW are contained in the most downstream area. In the condition 3, the product wafers PW are contained in the two upstream areas and the dummy wafers DW are contained in the two downstream areas. In the condition 4, the product wafers PW are contained in the most upstream area and the dummy wafers DW are contained in the three downstream areas. As described above, the conditions 1 to 4 are shown only by way of an example. Depending on the number of product wafers PW, there may be the case where the product wafers PW are contained in the course of a given area, and the dummy wafers DW are contained in a remaining part of the area.

<Evaluation of Film Thicknesses When $H_2$ Gas is Supplied from Each Additional Nozzle>

Figure 5:
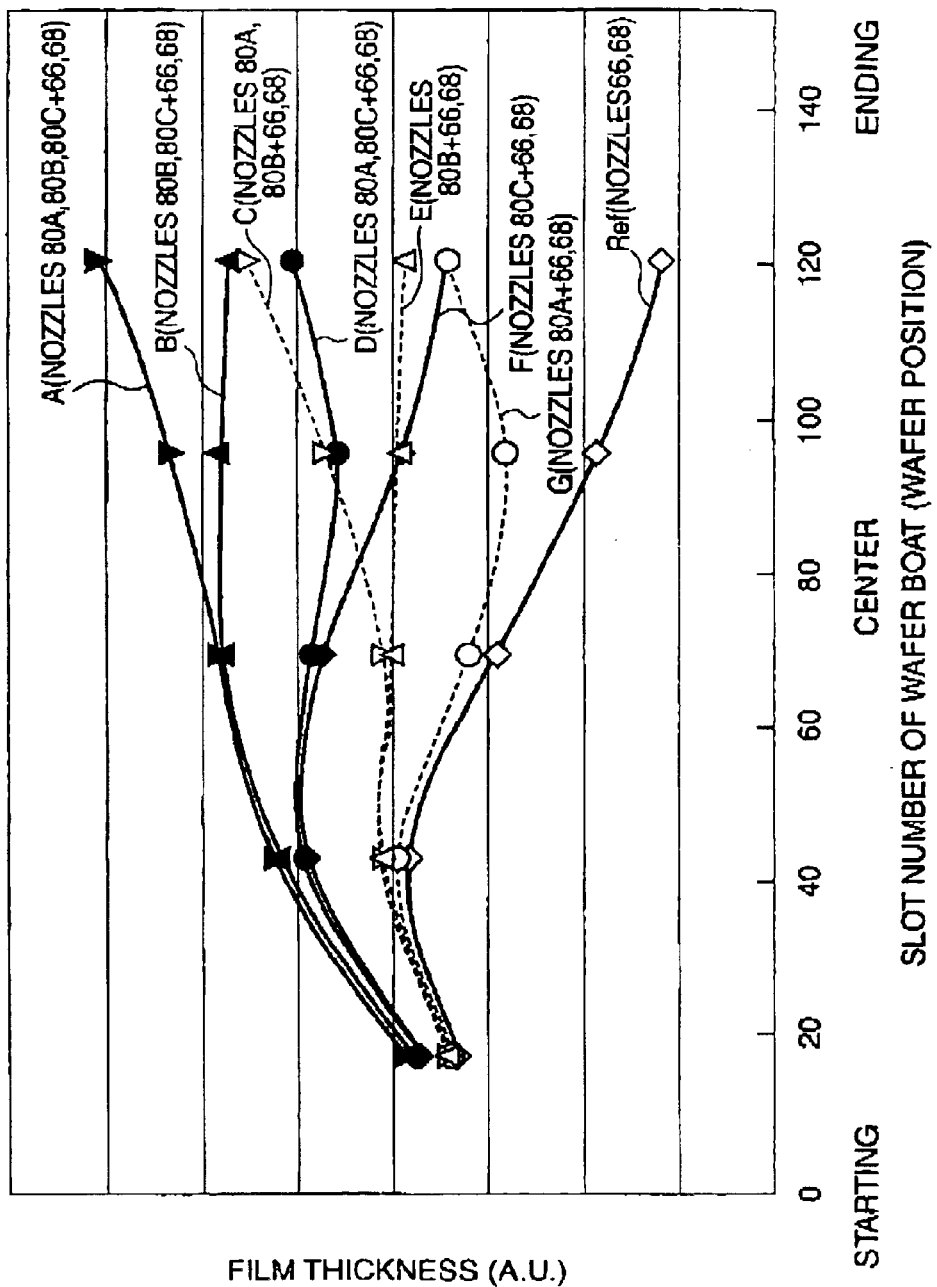
FIG. 5 is a graph showing an effect given to a film thickness when an H$_2$ gas is supplied from each additional nozzle.

Then, effects given to the film thicknesses when the $H_2$ gas was supplied from each additional nozzle 80A to 80C were evaluated. The evaluation results are described below. FIG. 5 is a graph showing an effect given to a film thickness when the $H_2$ gas is supplied from each additional nozzle. (In FIG. 5, Y axis represents film thickness is arbitrary unit.) The axis of abscissas shows slot numbers of the wafer boat holding the wafers. The respective plotted values indicate film thicknesses of the five monitor wafer MW shown in FIG. 4. Herein, a film forming is shown when the wafer contained in the wafer boat 36 were all the product wafers PW (condition 1).

In FIG. 5, the curves A to G shown seven gas supply conditions, and the curve "Ref" shows a gas supply condition of a conventional system. That is, the curve "Ref" shows a film thickness for a total gas flow ($O_2$ and $H_2$) of 5260 sccm supplied only from the nozzles 66 and 68 shown in FIG. 1. In the curves A to G, the flow rates of the $O_2$ gas and the $H_2$ gas respectively supplied from the nozzles 66 and 68 were fixed, while a part of the $H_2$ gas was additionally supplied from each additional nozzle 80A to 80C, or from the combination thereof. That is, the curve A shows a result where parts of the $H_2$ gas were supplied from the additional nozzles 80A to 80C. The curve B shows a result where parts of the $H_2$ gas were supplied from the additional nozzles 80B and 80C. The curve C shows a result where parts of the $H_2$ gas were supplied from the additional nozzles 80A and 80B. The curve D shows a result where parts of the $H_2$ gas were supplied from the additional nozzles 80A and 80C. The curve E shows a result where a part of the $H_2$ gas was supplied from the additional nozzle 80B. The curve F shows a result where a part of the $H_2$ gas was supplied from the additional nozzle 80C. The curve G shows a result where a part of the $H_2$ gas was supplied from the additional nozzle 80A.

For this experiment, wafers of 200 mm in diameter were used. When supplying the $H_2$ gas from each additional nozzle 80A to 80C, each flow rate was fixed to be 100 sccm.

As apparent from the film thickness distribution shown in FIG. 5, the curve Ref as a reference shows film thicknesses which are smaller in any wafer positions. The curves A to G show that the film thicknesses are larger as a whole in the respective separate wafer positions depending on the gas supply conditions. Thus, it is found that a controllability of film thickness can be improved by changing gas flow rates additionally supplied from the additional nozzles 80A to 80C. In this case, the film thickness distributions shown in FIG. 5 may be measured not only for the condition 1 shown in FIG. 4, but also for all the conditions 1 to 4 shown in FIG. 4. In this way, a precision of the gas flow rate upon a simulation can be improved.

Based on the film thickness distributions shown in FIG. 5, the flow rate of each part of the gas supplied from each additional nozzle 80A to 80C is calculated by an experiment or a simulation with respect to the conditions 1 to 4 shown in FIG. 4, such that a high interfilm thickness uniformity of the films can be maintained. That is, the gas flow rate supplied from each additional nozzle 80A to 80C is optimized with respect to the conditions 1 to 4. When the number of conditions for containing the wafers is increased, the precision for controlling the gas flow rate can be enhanced. In the actual oxidation treatment, the gas flow rate is controlled based on a corresponding condition or a closed condition.

Figure 6:
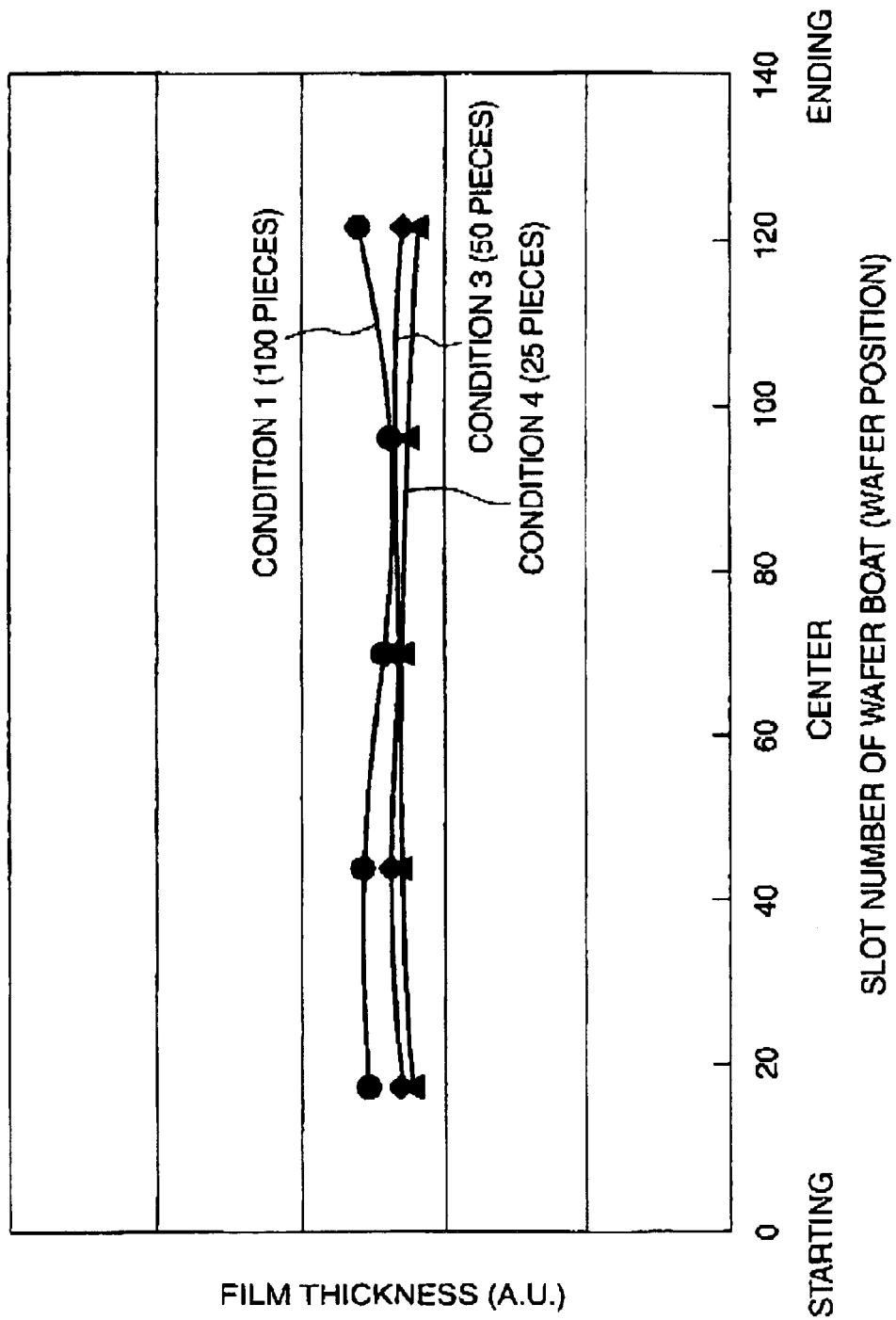
FIG. 6 is a graph showing film thickness distribution of wafers when the wafers are subjected to an oxidation treatment with a gas flow rate for each nozzle optimized for each batch condition.

Then, the flow rate of each part of the additionally supplied $H_2$ gas from each additional nozzle 80A to 80C with respect to the conditions (excluding condition 2) based on the above simulation results and the interfilm thickness uniformity were evaluated. The flow rate of each part of the $H_2$ gas supplied from each additional nozzle 80A to 80C was calculated based on a simulation with respect to the respective conditions (see, FIG. 4). FIG. 6 is a graph showing film thickness distribution of wafers when the wafers are subjected to an oxidation treatment with the gas flow rate for each nozzle 80A to 80C optimized for bath sizes of 25, 50 and 100 pieces. (In FIG. 6, Y axis represents film thickness in arbitrary unit.)

As apparent from FIG. 6, in the conditions 1, 3, and 4, a film thickness difference was significantly small in the wafers. Thus, irrespective of the containing condition of the product wafers PW, that is, irrespective of the difference of the loading effect, it was found that the interfilm uniformity of the oxide film thicknesses could be significantly improved by optimizing the flow rate of each part of the $H_2$ gas additionally supplied from each additional nozzle 80A to 80C. In general, an interfilm uniformity equal to or less than 0.5% relative to a desired film thickness of, e.g., 1 to 20 nm is required. The optimizing way of the present invention satisfies the need. Therefore, it is found that the method according to the present invention is excellent in obtaining high interfilm thickness uniformity, even when a temperature in the furnace is substantially constant, by optimizing a concentration profile in the longitudinal direction of the furnace of the active oxygen species and the active hydroxyl species, irrespective of different loading effects. According to the present invention, when patterns of the semiconductor integrated circuits are changed, it is clear that the high interfilm thickness uniformity can be achieved by using the same experiment or simulation method. Further, as shown in FIG. 3, it is possible to generate active species for obtaining a desired film thickness from oxygen and hydrogen which are introduced to the processing vessel.

Figure 7:
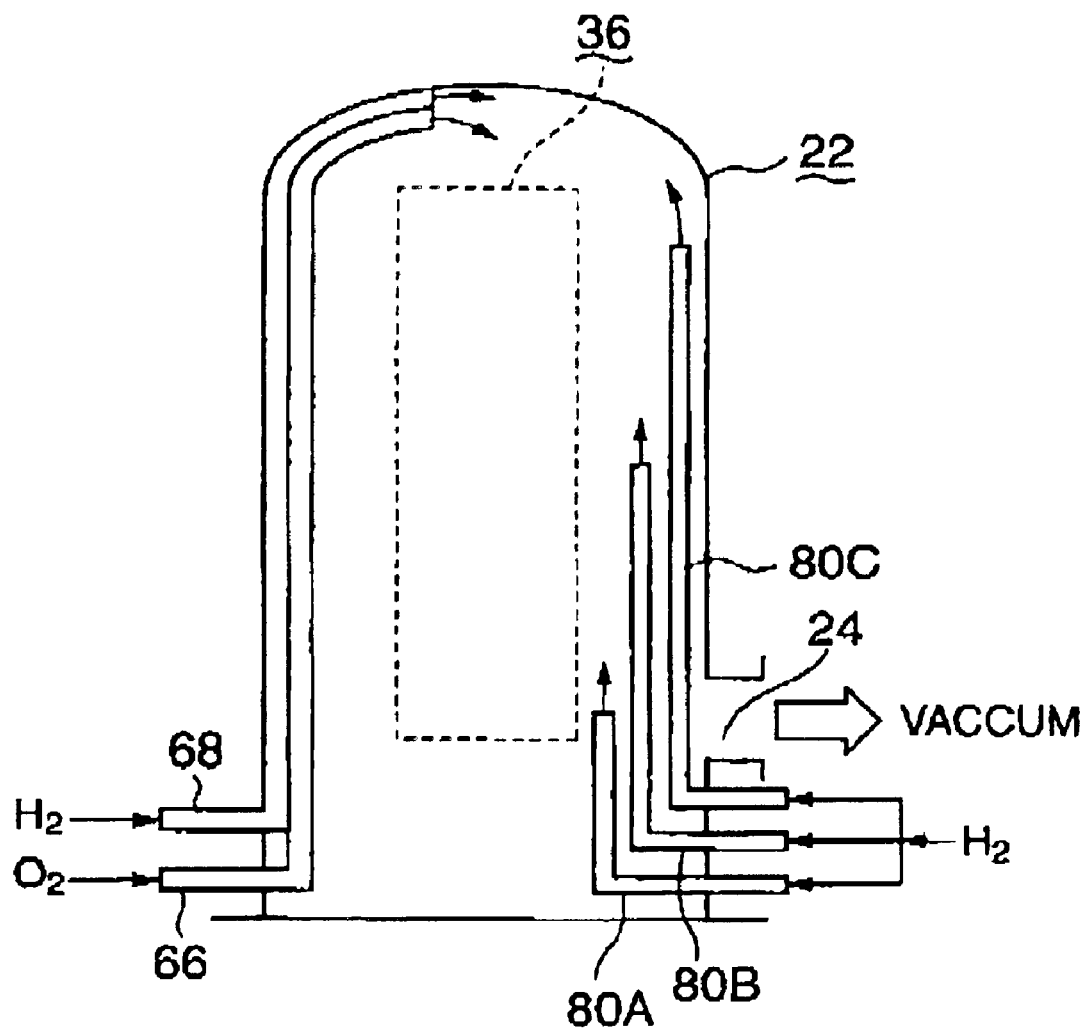
FIG. 7 is a structural view schematically showing another embodiment of the oxidation system.
Figure 8:
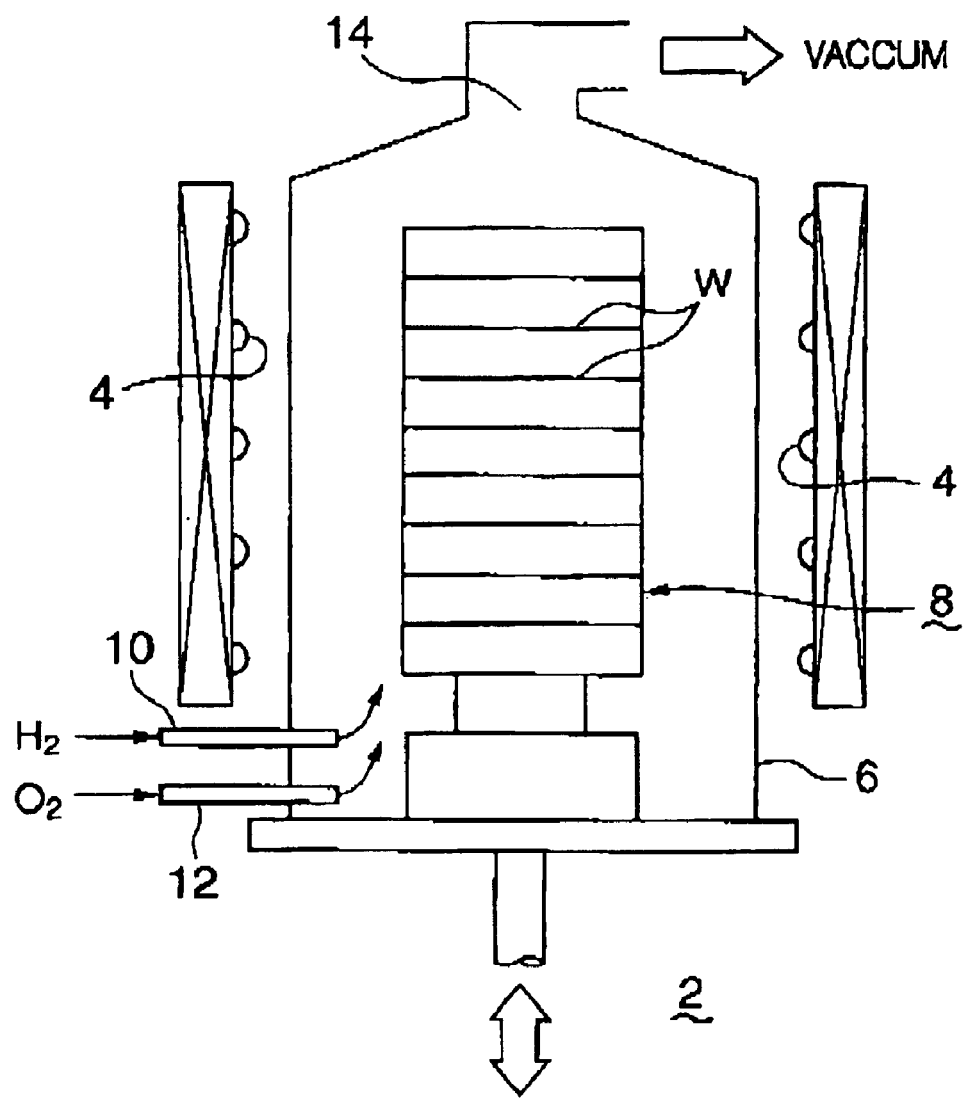
FIG. 8 is a structural view schematically showing a conventional oxidation system.

In the oxidation system shown in FIG. 1, the $O_2$ gas and the $H_2$ gas which are mainly supplied thereto are supplied from a lower part of the processing vessel 22. Then, the gases flow upward in the processing vessel 22, and are discharged outside the system through the exhaust port 24 disposed on the top of the processing vessel 22. However, not limited thereto, the oxidation system may take a constitution shown in FIG. 7. FIG. 7 is a structural view schematically showing another embodiment of the oxidation system. That is, in the oxidation system shown in FIG. 7, the nozzles 66 and 68 for respectively supplying the main $O_2$ gas and the $H_2$ gas are upwardly arranged along an inner surface of the processing vessel 22, with the respective gas injection ports being disposed on the top of the processing vessel 22. The exhaust port 24 is not disposed on the top of the processing vessel 22, but disposed on a sidewall on a lower part of the processing vessel 22. Thus, contrary to the oxidation system shown in FIG. 1, a gas flow is formed which moves from upward to downward in the processing vessel 22.

In the oxidation system shown in FIG. 7, the relation of the upstream region S3 and the downstream region S1 is of course vertically inverted, and also the gas supply conditions from the additional nozzles 80A to 80C are vertically inverted with respect to the conditions shown in FIG. 1.

In the above embodiments, the $O_2$ gas is used as the oxidative gas. However, not limited thereto, $N_2O$ gas, NO gas, $NO_2$ gas, and so on may be used. In the above embodiments, the $H_2$ gas is used as the reductive gas. However, not limited thereto, $NH_3$ gas, $CH_4$ gas and HCl gas may be used.

The oxidation treatment discussed here may also be carried out with the combination of a temperature gradient along the longitudinal direction of the processing vessel with multi injector technology, using at least three nozzles.

Not limited to the semiconductor wafers as work pieces, the present invention may be applied to LCD substrates, glass substrates, and so on.

What is claimed is:

1. A method of oxidizing work pieces comprising the steps of:

containing a plurality of work pieces in a processing vessel which has a predetermined length and is capable of forming a vacuum therein, and oxidizing surfaces of the work pieces in an atmosphere including active oxygen species or active hydroxyl species which are generated by supplying an oxidative gas and a reductive gas into the processing vessel to interact the gases, the oxidative gas and the reductive gas being respectively supplied in the vessel in the longitudinal direction, wherein the reductive gas is supplied additionally from at least two or more independently controlled gas nozzles located at separate locations in the longitudinal direction of the processing vessel; and the gas flow rate through each nozzle is set depending on any combination of the work pieces consisted of product wafers and dummy wafers or monitor wafers in the processing vessel.

2. A method of oxidizing work pieces comprising the steps of:

containing a plurality of work pieces in a processing vessel which has a predetermined length and is capable of forming a vacuum therein, and oxidizing surfaces of the work pieces in an atmosphere including active oxygen species or active hydroxyl species which are generated by supplying an oxidative gas and a reductive gas into the processing vessel to interact the gases, the oxidative gas and the reductive gas being respectively supplied in the vessel in the longitudinal direction, wherein supplying at least three independently controlled reductive gas nozzles are located at separate locations in the longitudinal direction of the processing vessel; and controlling the gas flow rates through each nozzle is set depending on any combination of the work pieces consisted of product wafers and dummy wafers or monitor wafers in the processing vessel.

3. The method of oxidizing work pieces according to claim 1 or 2, wherein containing the work pieces in the processing vessel consist of any number of product wafers.

4. The method of oxidizing work pieces according to claim 1 or 2, wherein controlling the flow rate through each reductive gas nozzle is set based on the desired film thicknesses.

5. The method of oxidizing work pieces according to claim 1 or 2, wherein controlling the flow rate through each reductive gas nozzle is set based on the desired longitudinal concentration profile of active oxygen species or the active hydroxyl species within the processing vessel.

6. An oxidation system comprising:

a holding means which holds a plurality of work pieces at predetermined pitches;

a processsing vessel which has a predetermined length for containing the holding means, and is capable of forming a vacuum therein;

a heating means which heats the work pieces;

an oxidative gas supply means which supplies an oxidative gas into the processing vessel;

a reductive gas supply means which supplies a reductive gas into the processing vessel including at least three independently controlled reductive gas nozzles for supplying the reductive gas to separate locations along the longitudinal direction of the processing vessel; and a system controller controlling the individual gas flow rate of the reductive gas supplied from the reductive gas nozzles.

7. The oxidation system according to claim 6, wherein the work pieces held by the holding means consist of any number of product wafers.

8. The oxidation system according to claim 6 or 7, wherein the system controller controls the individual flow rate of the reductive gas supplied from at least said three independently controlled reductive gas nozzles based on the desired film thicknesses.

9. The oxidation system according to claim 7, wherein the system controller sets controlling the flow rate of each reductive gas nozzle so as to provide the desired concentration profile in the longitudinal direction of the active oxygen species or the active hydroxyl species.

* * * * *